United States Patent [19]

Matthews

[11] Patent Number: 5,336,926

[45] Date of Patent: Aug. 9, 1994

[54] BIPOLAR JUNCTION EXHIBITING SUPPRESSED KIRK EFFECT

[75] Inventor: James A. Matthews, Milpitas, Calif.

[73] Assignee: MicroUnity Systems Engineering, Inc., Sunnyvale, Calif.

[21] Appl. No.: 113,510

[22] Filed: Aug. 27, 1993

Related U.S. Application Data

[63] Continuation of Ser. No. 840,853, Feb. 25, 1992, abandoned.

[51] Int. Cl.$^5$ .................. H01L 29/72; H01L 21/265
[52] U.S. Cl. .................. 257/657; 257/592; 257/593; 257/754; 257/370; 257/927; 437/31; 437/34; 437/56; 437/69
[58] Field of Search .............. 257/592, 593, 657, 754, 257/927, 370; 437/69, 56, 31, 34

[56] References Cited

U.S. PATENT DOCUMENTS 4,996,581 2/1991 Hamasaki .................. 357/34

Primary Examiner—Edward Wojciechowicz
Attorney, Agent, or Firm—Burns, Doane, Swecker & Mathis

[57] ABSTRACT

A bipolar junction transistor (BJT) which exhibits a suppressed Kirk Effect comprises a lightly-doped n-type collector region formed above a more heavily-doped n+ layer. Directly above the collector is a p-type base which has an extrinsic region disposed laterally about an intrinsic region. An n+ emitter is positioned directly above the intrinsic base region. The BJT also includes a localized n+ region disposed directly beneath the intrinsic base region which significantly increases the current handling capabilities of the transistor.

26 Claims, 4 Drawing Sheets

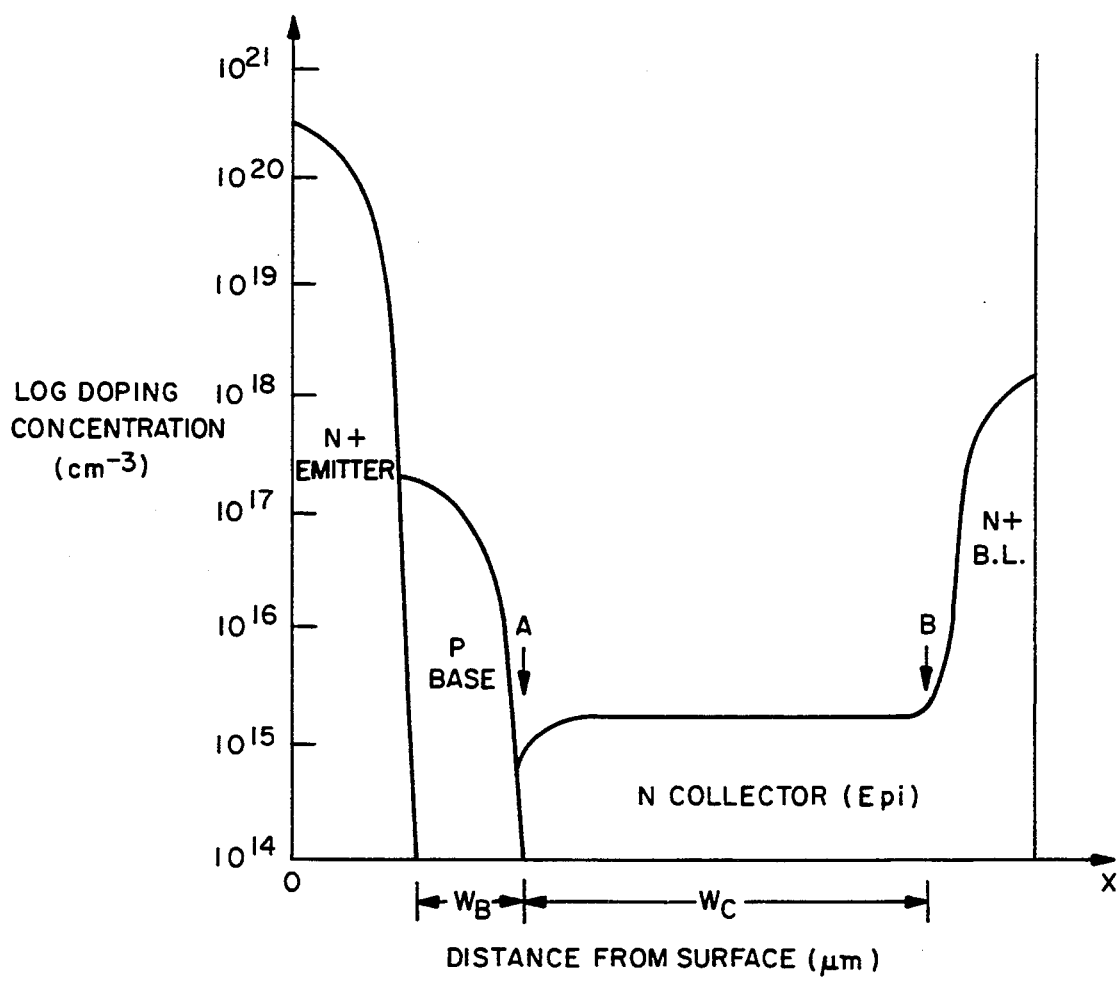
FIG _ 1 (PRIOR ART)
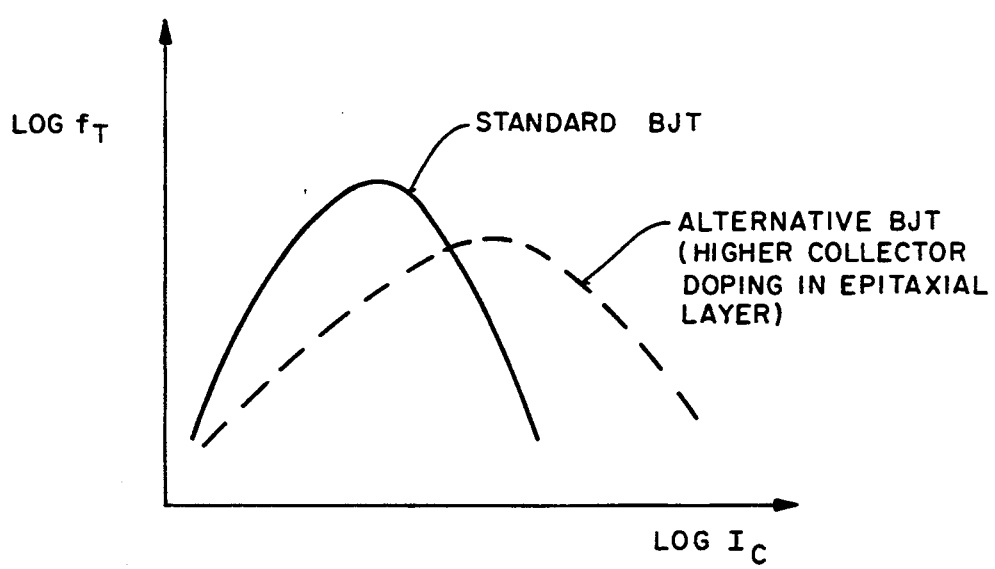
FIG _ 2 (PRIOR ART)

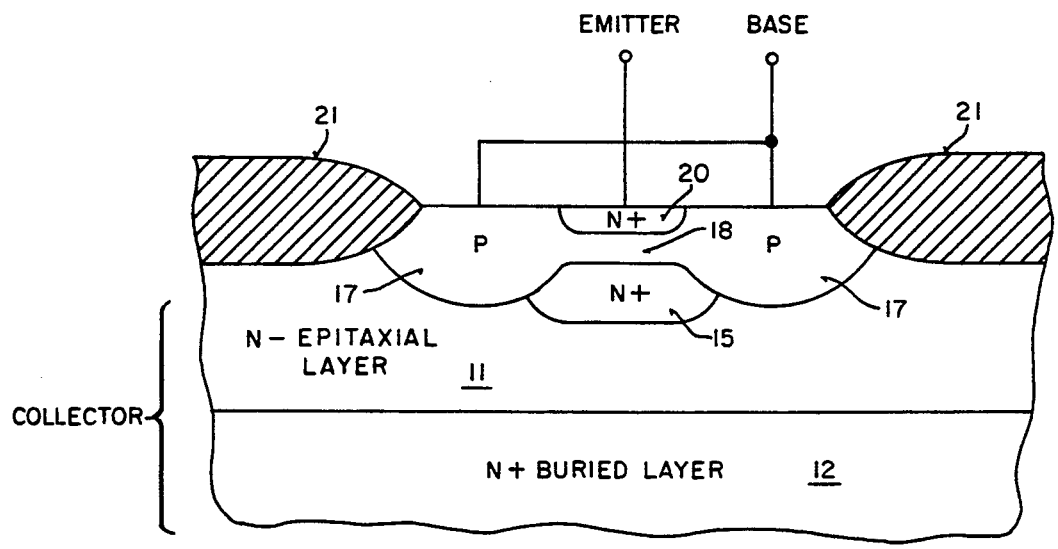
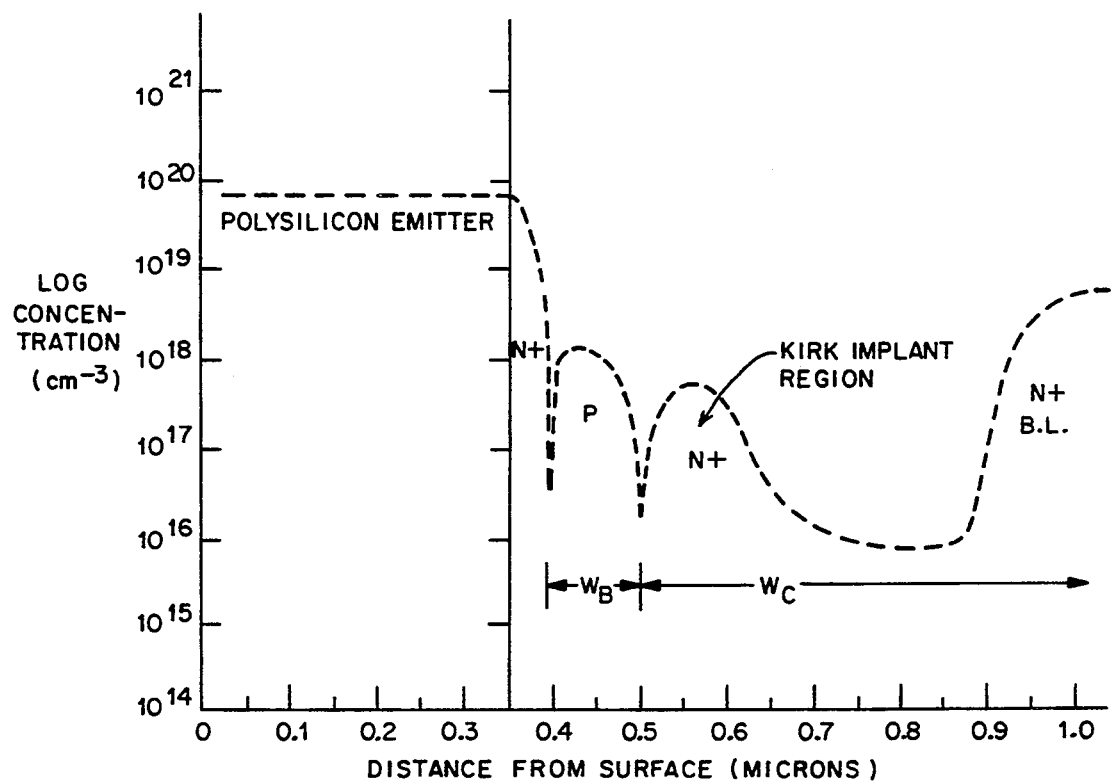

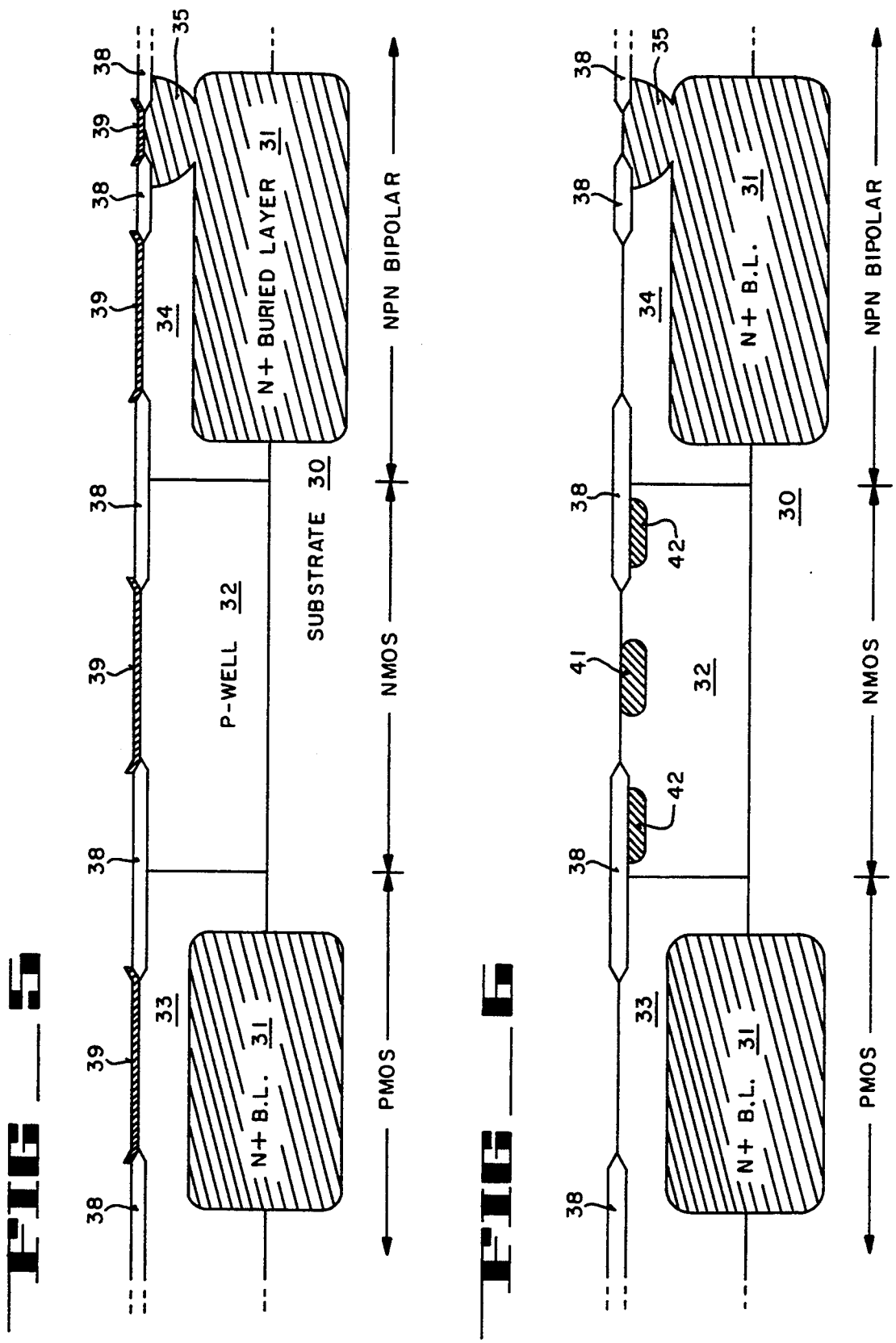

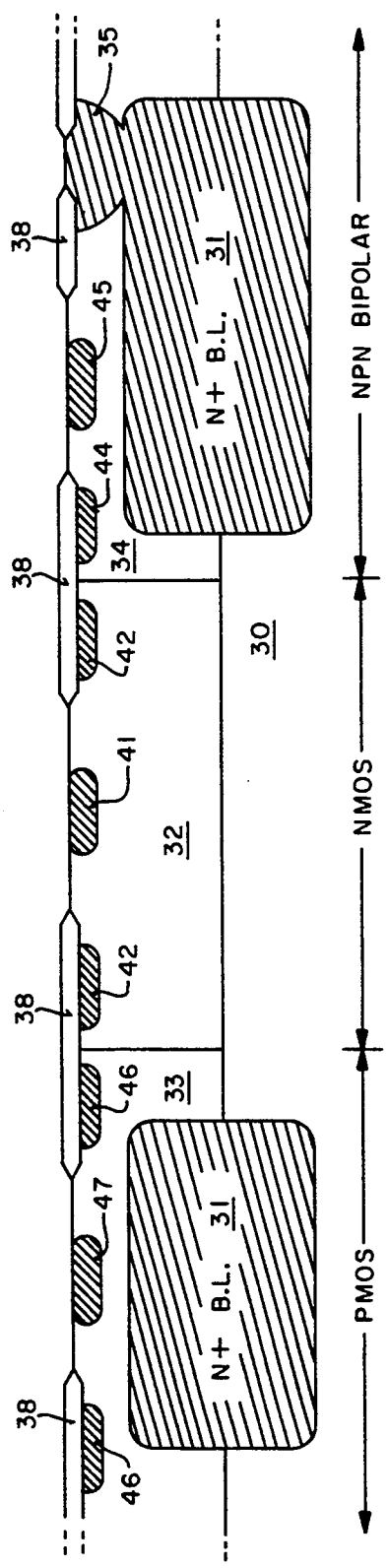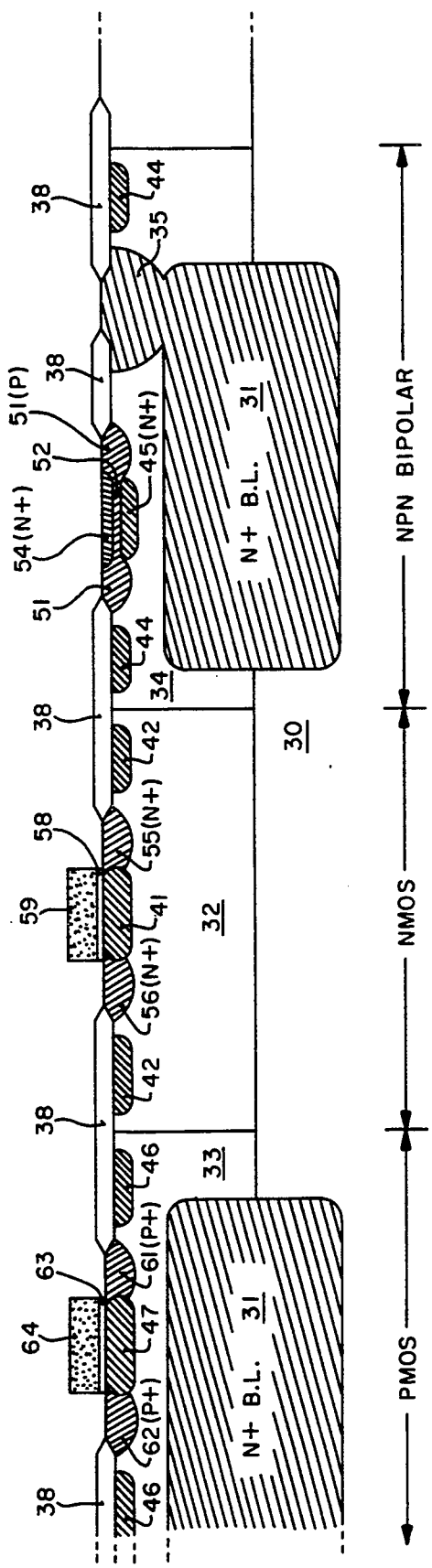

BIPOLAR JUNCTION EXHIBITING SUPPRESSED KIRK EFFECT

This is a continuation of application Ser. No. 07/840,854, filed Feb. 25, 1992, now abandoned.

FIELD OF THE INVENTION

The present invention relates generally to the field of semiconductor devices; more specifically, to bipolar junction transistors and to methods for fabricating such transistors.

BACKGROUND OF THE INVENTION

Since its invention, the bipolar junction transistor (BJT) has had an enormous impact on virtual every area of modern life. Since this time, researchers have been working diligently to ever expand the limits of its performance. For example, much effort have been focused on the fabrication of high frequency transistors having extremely small device sizes. In such devices, it is important to keep the emitter, base, and collector resistances at a minimum when considering the design of a high frequency device since the effective resistance associated with each area affects the various RC charging times.

Consider the doping profile of a typical prior art bipolar junction transistor as shown in FIG. 1. As can be seen, the emitter doping concentration is extremely high—on the order of $10^{20}$–$10^{21}$ atoms/cm$^2$. The doping concentration in the base region typically ranges from $10^{17}$–$10^{18}$ atoms/cm$^2$. The collector region is normally the most lightly-doped region of the bipolar junction transistor.

As shown in FIG. 1, the collector region usually comprises an n-type epitaxial layer which is doped to approximately $10^{15}$ atoms/cm$^2$. It is worth noting that the collector doping profile is intentionally kept flat from the base collector junction (e.g., point A) extending down to the more heavily doped n+ buried layer region (e.g., beginning at point B). Minimizing base-collector capacitance is one of the chief reasons why the doping level in the epitaxial collector region is kept at a minimum.

One of the common problems associated with the standard bipolar junction transistor is that the performance of the device is limited at high current densities. This limitation arises because of the so-called "Kirk Effect". The Kirk Effect—also frequently referred to as current-induced base push-out—occurs at very high injection levels and very high current densities. In modern BJTs having a lightly-doped epitaxial collection region, the current gain is directly affected by the relocation of the high-field region from point A to point B (see FIG. 1) under high-current conditions. This high field phenomena (i.e., the Kirk Effect) effectively increases the base width from $W_B$ to $(W_B+W_C)$. Increasing the effective base width in this manner also increases the effective base Gummel number, which represents the number of impurities per unit area in the base region. A higher Gummel number causes a corresponding reduction of the current gain in the device.

The Kirk Effect also influences the high frequency performance of bipolar transistors. Because of the Kirk Effect, there is an optimum collector current that gives the maximum cut-off frequency for the standard BJT. This behavior is shown by the solid line in FIG. 2. Beyond the optimum collector current level, further increases in current are made possible only by lowering the maximum frequency of operation of the device (i.e., $f_T$).

One prior art approach for combating the adverse effects of the Kirk Effect involves uniformly increasing the doping throughout the epitaxial collector region. The problem with this approach is that increasing the collector doping throughout the epitaxial layer greatly increases the collector junction capacitance, resulting in a lower $f_T$. This latter approach is shown by the dashed line in FIG. 2. Thus, a higher epitaxial doping level permits a moderate increase in the current handling capacity of the device, but only at the expense of lowered frequency performance.

Therefore, what is needed is a bipolar junction transistor capable of suppressing the Kirk Effect to allow much higher current densities than achievable under prior art approaches.

SUMMARY OF THE INVENTION

A bipolar junction transistor (BJT) which effectively suppresses current-induced base push-out—otherwise known as the Kirk Effect—is disclosed. In one embodiment, the BJT of the present invention includes an n-type collector disposed in a substrate. The collector comprises a lightly-doped region formed above a more heavily-doped layer. Directly above the collector is a p-type base which has an extrinsic region disposed laterally about an intrinsic region. An n-type emitter is positioned directly above the intrinsic base region.

The BJT also includes a localized n-type region disposed in the collector substantially beneath the intrinsic base region. Importantly, the localized region has a doping concentration which is significantly higher than that of the lightly-doped collector region. The higher doping in the localized region acts to increase the current handling capabilities of the BJT by suppressing the deleterious consequences of the Kirk Effect.

A method of fabricating the novel BJT as part of a process for forming field-effect transistors (FETs) and bipolar junction transistors on the same substrate is also described. In accordance with the invented method, a single implant step is utilized to establish the field threshold for the BJTs and p-channel FETs. The same implant is also used to form punchthrough stop areas for the p-channel FETS and create the localized regions for the BJTs.

BRIEF DESCRIPTION OF THE DRAWINGS

The present invention is illustrated by way of example and not limitation in the figures of the accompanying drawings, in which like references indicate similar elements, and wherein:

FIG. 1 is a doping of a prior art bipolar junction transistor.

FIG. 2 illustrates how the Kirk Effect restricts the current handling capability of two types of prior art transistors.

FIG. 3 is a cross-sectional elevation view of the bipolar junction transistor of the present invention.

FIG. 4 shows a doping profile for the currently preferred embodiment of the present invention.

FIG. 5 illustrates a cross-sectional view of a substrate in which bipolar junction transistors and field effect devices are fabricated alongside one another. The view of FIG. 5 also shows the substrate following definition of the active areas and growth of field oxidation regions.

FIG. 6 is a cross-sectional view of the substrate of FIG. 5 following the implantation step which establishes the field threshold and also provides a punch-through stop region for the n-channel MOS device.

FIG. 7 is cross-sectional view of the substrate of FIG. 6 taken after an implantation step which establishes the field threshold for the p-channel MOS and bipolar transistors, the punchthrough stop for the p-channel device, and the localized n+ region for suppressing the Kirk Effect in the bipolar junction transistor.

FIG. 8 is a cross-sectional view of the substrate of FIG. 7 taken after formation of the intrinsics, extrinsic, base regions and emitter region of the bipolar junction transistor. FIG. 8 also shows the MOS devices after formation of the source and drain regions and gate electrodes.

DETAILED DESCRIPTION

A bipolar transistor comprising emitter, base, and collector regions is described wherein numerous specific details are set forth, such as specific doping levels, processing steps, dimensions, etc., in order to provide a thorough understanding of the present invention. It will be obvious, however, to one skilled in the art, that these specific details may not be needed to practice the present invention. In other instances, well-known structures and processing techniques have not been shown in detail in order to avoid unnecessarily obscuring the present invention.

With reference to FIG. 3, a cross-sectional view of the bipolar junction transistor (BJT) of the present invention is shown. The BJT includes an n-type buried layer 12 disposed beneath an n-type epitaxial layer 11. The epitaxial collector layer 11 is doped with n-type impurities to a concentration of approximately $10^{16}$ atoms/cm$^3$, whereas the concentration in buried layer 12 is considerably higher.

FIG. 3 also shows an n+ emitter region 20 disposed in a p-type base which comprises intrinsic region 18 and extrinsic regions 17. Note that intrinsic region 18 lies directly below emitter region 20. Extrinsic regions 17 are disposed laterally about intrinsic region 18 and generally adjacent to emitter region 20. It is appreciated by practitioners in the art that the majority of current flow in the base region of the BJT of FIG. 3 occurs primarily through intrinsic region 18. The electrical contact to the base region is normally made through extrinsic regions 17. (Note that in FIG. 3 the contact structure for the emitter and base regions is not shown to avoid detracting from the present invention).

Beneath intrinsic base region 18 is a heavily-doped localized n+ region 15. Localized region 15 is disposed beneath intrinsic layer 18 to improve the high current operation of the transistor without a large increase in the base-to-collector capacitance. Any increase in the base-collector capacitance is minimized by confining localized region 15 substantially under the intrinsic portion of the base—not allowing it to extend out, under or across extrinsic regions 17. Obviously, the capacitance between extrinsic base region 17 and any portion of localized region 15 which overlaps region 17 will be quite high. For this reason, any overlap is intentionally avoided so that the net effect is to minimize the base-collector capacitance while maintaining a high collector doping level in the area of highest current density. This aspect of the present invention will be explained in more detail below.

More importantly, including a highly doped collector region which is localized directly beneath intrinsic base region 18 suppresses the Kirk Effect such that the current handling capacity of the transistor is markedly improved. On the other hand, the collector portion of epitaxial layer 11 that is located directly below extrinsic base regions 17 (and below localized region 15) is doped to a relatively low impurity concentration level. This results in a greatly reduced base-collector capacitance since the majority of that capacitance comes from the junction between extrinsic regions 17 and epitaxial layer 11. Localizing the heavily-doped region 15 below intrinsic base region 18 also allows the depletion region of the extrinsic base to extend far down into the substrate.

FIG. 4 illustrates the vertical doping profile through the emitter for the currently preferred embodiment of the present invention. In accordance with the preferred embodiment, a hypershallow emitter junction is formed below the surface of the substrate by diffusion of arsenic from a polysilicon layer formed on the substrate surface. The doping concentration of the emitter region is on the order of $10^{20}$ atoms/cm$^3$. The intrinsic base region disposed below the emitter has a base width of approximately 0.1 micron wide and a doping concentration of approximately $10^{18}$ atoms/cm$^3$. Localized Kirk Effect implant region 15 appears in FIG. 4 directly below the intrinsic base region as a heavily-doped area having a distribution which gradually tapers off into the lightly-doped epitaxial layer 11. The doping concentration in region 15 is preferably on the same order as that of the base, whereas the doping concentration of the collector is substantially lower (on the order of $10^{16}$ atoms/cm$^3$).

One of the salient features of the present invention is that by forming a heavily-doped localized collector region directly below the intrinsic base, the base region is prevented from "pushing-out" under high injection and high current level conditions. In other words, localized region 15 preserves the location of the intrinsic base-to-collector pn junction despite any increase in the current density of the collector. By making the localized region have a doping concentration comparable to that of the intrinsic base, the vertical location of the base-collector junction (as well as the effective base width) is firmly established.

Another benefit of including a heavily-doped localized region 15 is that any subsequent high temperature processing cycles which might tend to cause the base to diffuse deeper into the collector region have no effect. That is, any migration of the base into the collector which would extend the base width is effectively prevented from occurring. Although impurities in the intrinsic base regions may still diffused downward into the collector, the n-type impurities in Kirk implant region 15 also diffuse in the opposite direction—upwards into the intrinsic base region. Because both regions preferably have similar doping concentrations, the base-collector junction basically stays in the same place. Thus, the retrograde Kirk implant profile firmly maintains the depth of the base-collector junction (as well as the base width of the device).

It should be understood that the increase in current handling capability of the present invention does not come at the expense of reduced high frequency operation (i.e., $f^T$). High frequency performance is preserved due to the fact that localized region 15 adds only a minimal contribution to the overall base-collector capacitance. As explained earlier, this is because the localized Kirk implant region 15 is confined under intrinsic base region 18, and does not appreciably extend beneath extrinsic region 17. Thus, the effect of localized region 15 is to suppress the Kirk Effect while preserving the high frequency performance of the transistor.

Practitioners will further appreciate that there exist numerous processing methods for fabricating the bipolar junction transistor illustrated in FIG. 3. By way of example, an ion implantation step may be performed after formation of the n-type epitaxial collective layer 11. The implantation step would introduce n-type impurities such as phosphorous into the substrate in order to form localized region 15. Well-known processing steps can then be used to subsequently form the base and emitter regions for the device. Obviously, many other possible processing sequences exist. According to the currently preferred method of fabrication, the BJT of FIG. 3 is fabricated in a process for simultaneously forming bipolar and MOS devices in the same silicon substrate, as described below.

FIG. 5 illustrates a cross-sectional view of a substrate in which bipolar and MOS devices are fabricated together in accordance with the presently invented process. For example, FIG. 5 shows silicon nitride masking members 39 formed on the surface of the silicon substrate. The substrate includes an epitaxial layer which includes an n-well region 33, a p-well region 32, and an n-type region 34. Regions 33 and 32 accommodate the p-channel MOS (PMOS) and n-channel MOS (NMOS) transistor types, respectively, whereas region 34 provides the collector region for the npn bipolar transistor. In the case of the BJT, an n+ buried layer 31 extends from well region 34 into the bulk of substrate 30. An n+ collector plug region 35 provides a means of making electrical contact to buried layer 31 from the surface of the substrate.

Also shown is an n+ buried layer 31 disposed between region 33 and substrate 30. Buried layer region 31 is employed in conjunction with the operation of the PMOS transistor.

After the silicon nitride layer has been patterned to form masking members 39, an oxidation step is performed to grow field oxide regions 38. Field oxide regions 38 are preferably on the order of 1000 Å thick and provide a means of isolating adjacent devices.

Once the field oxidation growth has been completed, silicon nitride masking members 39 are removed and a sacrificial gate oxide is grown. The sacrificial gate oxide is subsequently etched away after growth to remove any thermal nitridation which may have occurred at the substrate surface. Next, a permanent gate oxide is grown in those areas where MOS devices will be formed.

After growth of the sacrificial gate oxide, the substrate is appropriately masked and an ion implantation is performed over selected areas of the n-channel devices. The result of this implant step is shown in FIG. 6. In the current process, a mask is utilized that opens areas over p-well 32 (i.e., the NMOS transistor) that correspond to the intrinsic enhancement mode MOS transistor. This masking step also opens areas over the field oxide in the NMOS device. Two implants are performed. The first is a high energy boron implant (B11 at 150 KeV) that produces a deep punchthrough stop in the intrinsic FET (i.e. in the eventual channel region of the NMOS transistor). This same implant step also produces the shallow field threshold implant regions 42. Implant regions 42 are formed by penetration of the ions directly through the exposed field oxide regions 38. Because the field oxide is intentionally grown to be thin (e.g., approximately 1000 Å) the field threshold implant is easily performed directly through field oxide regions 38.

Implanting after field oxidation growth avoids segregation, thereby maintaining a higher surface doping concentration. This allows a lower dose implant to be more effective. Furthermore, due to the lower implant dose needed, fewer oxide stacking faults (OSFs) result. This latter point is important since any implant damage that might result from the ion implantation process occurs after oxidation rather than before. This means that the integrity of the grown oxide is preserved and crystalline damage is minimized.

Another feature of the present invention is also apparent in the illustration of FIG. 6. Field implant regions 42 are shown being spaced away from the edges of field oxidation regions 38, which define the active area for the NMOS device. In the currently preferred embodiment, the field implant is spaced approximately 0.25 microns away from the active edges. This spacing is deliberate in that it prevents the generation of a large p+ to n+ capacitance which normally occurs after formation of the source and drain regions in conventional processes. Spacing the field threshold regions away from the active edges also helps to reduce breakdown problems. Indeed, in the case of the BJT, the breakdown voltage is efficiently raised to over 15 volts. Also, maintaining p+ field threshold regions 42 away from the n+ source drain regions significantly reduces junction edge capacitance. Additionally, there is no dopant encroachment to affect the threshold voltage of narrow transistors.

After the high energy deep implant which forms punchthrough stop region 41 and field threshold regions 42, a low energy boron implant is performed to set the threshold voltage of the NMOS enhancement device. Note that this step may be performed using the same mask as the previous implant. Due to the relatively low energy of this implant (approximately 30 KeV) most of the dopant is blocked out of the field regions by the thickness of field oxide regions 38. Thus, the combination of the deep and shallow implants allows independent setting of both the field-effect device threshold and the field threshold in a self aligned manner.

It should be pointed out that the described sequence illustrates the formation of an enhancement mode FET. By blocking the implant from the intrinsic region under the gate using appropriate masking a so-called natural NMOS device is created having a voltage threshold near zero. Such devices are often useful since they provide a higher drain current for circuit applications where the leakage current associated with this type of FET is tolerable.

Due to the symmetry of the process, it is also possible to implant the PMOS enhancement implant into the NMOS device to make a depletion mode NMOS device having a negative voltage threshold. Such a device is frequently employed as a current source in certain types of logic circuits.

Following the punchthrough and field implant steps associated with the NMOS devices, a similar implant sequence is performed for the PMOS devices and for the npn bipolar transistors. Of course, the order of the implants—that is, whether the PMOS or NMOS devices are implanted first—may be switched without adverse effects. FIG. 7 is a cross-sectional view of the substrate following these implant steps into the PMOS, NMOS and the bipolar junction transistor regions. As was the case for the NMOS device, a single mask is employed to expose the appropriate areas in the intrinsic FET region of the PMOS device.

After masking, a single, high energy phosphorous implant is utilized to form the punchthrough stop region and also to establish the enhancement mode PMOS voltage threshold. By way of example, a deep phosphorous implant (e.g., 100 KeV, $8.0 \times 10^{12}$ atoms/cm$^2$) is performed in the current process. This creates punchthrough stop region 47 and field threshold regions 46. As before, field threshold regions 46 for the PMOS devices are formed by implantation implanted directly through field oxide regions 38. Furthermore, regions 46 are spaced a predetermined distance (e.g., ~0.25 microns) from the edges of the active area. A second, shallower implant follows the deep implant. This shallower implant establishes the voltage threshold of the PMOS enhancement device. Thus, three types of devices—enhancement, depletion and natural voltage threshold devices—are available in accordance with the presently invented process.

It is appreciated that there are several important benefits of the currently preferred method over prior art processes. By way of example, in the field regions it is often desirable to have a shallow implant in order to have the greatest influence on the field threshold. This is accomplished in accordance with the present invention by implanting directly through the field oxide region. In prior art processes characterized by much greater field oxide thicknesses, this is not possible. Being able to implant through the field oxide means that the field threshold control implant can be made that much shallower (e.g., by the thickness of the field oxide itself.)

Another salient feature of the invention is that because the field implant is normally masked—and not self-aligned as in traditional LOCOS processes—the implant may be spaced back away from the edge of active regions. This permits greater control over the exact location and placement of the implant dose. In conventional processes, for instance, boron is frequently implanted into the substrate prior to field oxidation growth. Although this processing sequence does self-align the field implanted to the field oxide regions, much of the implant dose is often lost due to segregation and impurity capture in the newly grown field oxide. This has mandated the use of ever higher implant doses with a corresponding increase in the amount of damage inflicted upon the lattice structure by the impinging ions. As a consequence, past processes have frequently been characterized by a high density of crystallographic defects—typically oxidation induced stacking faults (OSFs) which tend to cause junction leakage and other associated problems.

In addition, lateral encroachment into the active area of the field implant is avoided in the present process. In past processes, this lateral encroachment produces a high junction peripheral capacitance and a lower breakdown voltage. In the case of narrow FETs, the encroachment also significantly increases the threshold voltage as part of the well-known narrow channel effect.

With continuing reference to FIG. 7, the same phosphorous implant that is used to create the punchthrough stop region 47 and field implant regions 46 for the PMOS device, is also implanted into the bipolar transistor to form field threshold regions 44 and localized n+ region 45. As was the case for the PMOS/NMOS devices, field threshold regions 44 result from implantation of a dopant species directly through field oxidation region 38. In addition, proper masking insures that this implant dose is spaced a predetermined distance away from the active edges of the bipolar device.

The deep phosphorous implant which forms regions 44 is also directed into the intrinsic portion of the bipolar transistor to serve as the "Kirk Effect suppressor". Note that this implant is performed so as to form localized n+ region 45 directly under the intrinsic base region of the BJT. Currently, the phosphorous implant is performed at approximately 100 KeV with a dose of $8.0 \times 10^{12}$ atoms/cm$^2$. Thus, by careful choice of field oxide thickness, implant energy, and dose (along with appropriate masking) a single masking/implant step forms the Kirk Effect suppressor region in the BJT, the punchthrough stop region for the p-channel FETs, and also sets the field threshold for the PMOS and bipolar devices.

FIG. 8 illustrates the PMOS, NMOS and npn bipolar devices following completion of the remaining fabrication steps (metallization steps omitted for clarity). Any one of a number of well-known BiCMOS processes may be employed for forming the source/drain FET regions and also the base and emitter regions of the BJT. In the preferred embodiment of FIG. 8, the npn bipolar transistor includes an intrinsic base region 52 formed by an ion implantation of boron just above localized Kirk Effect suppressor region 45. To the lateral sides of the intrinsic base, an extrinsic base 51 is formed by diffusion from boron ion implanted polysilicon contact members. Above the intrinsic base 52, an emitter region 54 is formed by diffusing arsenic into the substrate from a polysilicon contact member. Polysilicon emitters formed in this fashion exhibit high performance and are characterized by extremely shallow junction depths.

To complete the NMOS device, respective source and drain regions 55 and 56 are shown disposed in p-well 32 on adjacent sides of the channel region. Directly above the channel is an n+ doped polysilicon gate member 59 which is insulated from the underlying substrate by a thin gate oxide 58. (Note that the gate oxide 58 is normally grown in the process immediately after field oxidation).

The PMOS device shown in FIG. 8 similarly includes respective source and drain regions 61 and 62 formed within n-well region 33. Likewise, a gate oxide 63 insulates the p+ doped polysilicon gate member 64 from the underlying substrate.

Although the present invention has been described in conjunction with certain embodiments, it is appreciated that the invention may be implemented in a variety of other ways. By way of example, the implant step that forms the NMOS punchthrough and field threshold regions may optionally be performed either prior to or following the implant which establishes the same regions for the PMOS device and the Kirk Effect suppressor region. Consequently, it is to be understood that the particular embodiments shown and described by way of illustration are in no way intended to be limiting. Reference to the details of these embodiments is not intended to limit the scope of the claims which themselves recite only those features regarded as essential to the invention.

What is claimed is:

1. A bipolar junction transistor (BJT) formed in a semiconductor substrate comprising:

a collector disposed in said substrate, said collector including a lightly doped region disposed above a more heavily doped buried layer;

a base disposed above said collector region, said base comprising an extrinsic region disposed laterally about an intrinsic region;

an emitter disposed above said intrinsic base region; and said BJT including a localized region disposed in said collector directly beneath said intrinsic base region and above said buried layer, said localized region having a higher doping concentration than said lightly-doped collector region, said localized region and said emitter region having substantially the same width so as to increase the current handling capability while preserving high frequency performance when said BJT is operated in a high injection region.

2. The BJT of claim 1 wherein said localized region and said intrinsic base region have doping concentrations which are on the same order level of magnitude.

3. The BJT of claim 2 wherein said localized region is confined substantially beneath said intrinsic base region, and not beneath said extrinsic region, thereby minimizing collector-base capacitance.

4. The BJT of claim 3 wherein said base region comprises boron atoms and said localized region comprises phosphorous atoms.

5. The BJT of claim 4 wherein said collector further comprises a heavily-doped buried layer disposed beneath said lightly-doped region.

6. The BJT of claim 5 wherein said emitter is formed by diffusion of a dopant from a polysilicon layer into said substrate.

7. The BJT of claim 6 wherein said dopant comprises arsenic.

8. A npn bipolar junction transistor (BJT) formed along with field-effect devices on the same silicon substrate, said BJT comprising:

an n-type emitter disposed beneath the surface of said substrate, said emitter having a predetermined lateral dimension;

a p-type intrinsic base region disposed beneath said emitter;

a p-type extrinsic base region disposed laterally about said intrinsic base region and said emitter;

an n-type collector comprising a heavily-doped, localized n-type region disposed substantially beneath said intrinsic base region, but not beneath said extrinsic base region, and a lightly-doped region disposed beneath said localized region and said extrinsic base region, said localized region having a width which is substantially equal to said predetermined lateral dimension such that current-induced increases in the effective base width are suppressed while the current handling capability and high frequency performance of said BJT are enhanced when said BJT is operated in a high injection region; and wherein said localized region and said intrinsic base region both have doping concentrations on the same order of magnitude.

9. The BJT of claim 8 wherein said intrinsic base region comprises boron atoms and said localized region comprises phosphorous atoms.

10. The BJT of claim 9 wherein said collector further comprises a heavily-doped buried layer disposed beneath said lightly-doped region.

11. The BJT of claim 10 wherein said emitter is formed by diffusion of a dopant from a polysilicon layer into said substrate.

12. The BJT of claim 11 wherein said dopant comprises arsenic.

13. A BiCMOS process for fabricating a bipolar junction transistor (BJT) and a field-effect transistor (FET) on the same silicon substrate comprising the steps of:

defining a first active area for said BJT in a first portion of said substrate and a second active area in a second portion for said FET, said first portion comprising the collector of said BJT;

forming field oxide regions on the surface of said substrate bordering said first and second active areas;

implanting a dopant of said first conductivity type into said first and second active areas to create a doping concentration in a localized region of said first area which is substantially higher than that of said first portion of said substrate, said dopant also forming a punchthrough stop in said second active area for said FET;

forming a base region in said first active area having intrinsic and extrinsic regions, with said intrinsic region being disposed above, and forming a pn junction with, said localized region; and forming an emitter of said first conductivity type above said intrinsic base region, said emitter and said localized region having substantially the same lateral dimension so as to increase the current handling capability while preserving the high frequency performance of said BJT when said BJT is operated in a high-injection region.

14. The method of claim 13 wherein said doping concentration in said localized region is on the same order of magnitude as that of said extrinsic base region.

15. The method of claim 14 wherein said extrinsic region is disposed laterally to said intrinsic region.

16. A method of claim 15 wherein said implanting step also implants said dopant through selected areas of said field oxide regions to establish the field threshold for said BJT.

17. The method of claim 16 wherein said selected areas are disposed a predetermined distance away from said active area.

18. The method of claim 17 wherein said field oxide regions are approximately 1000 Å thick.

19. The method of claim 13 wherein said dopant comprises phosphorous and said implanting step is performed at approximately 150 KeV.

20. A process for forming a bipolar junction transistor (BJT) and a field-effect transistor (FET) in the same silicon substrate, said BJT having an emitter, a base, and a collector, said process comprising the steps of:

(a) providing a first well region in said substrate for said FET and a second well region in said substrate which comprises said collector of said BJT;

(b) patterning a masking layer formed on said substrate to define active areas for said FET and said BJT;

(c) forming field oxide regions on said substrate alongside said active areas;

(d) simultaneously implanting a dopant into said active areas of said FET and said BJT, said dopant forming a punchthrough stop in said FET and a heavily-doped, localized region in said collector of said BJT, said localized region suppressing the Kirk Effect in said BJT;

(e) forming said base of said BJT, said base having an intrinsic region disposed directly above, and forming a pn junction with said localized region, and an extrinsic region disposed laterally about said intrinsic region;

(f) forming said emitter of said BJT disposed above said intrinsic base region and directly above said localized region such that said emitter and said localized region have approximately the same lateral dimension thereby increasing the current handling capabilities while preserving the high frequency performance of said BJT when said BJT is operated in a high-injection region.

21. The process of claim 20 wherein said implanting step creates a doping concentration in said localized region which is from the same order of magnitude as that of said intrinsic base region.

22. The process of claim 21 wherein said implanting step implants said dopant through selected areas of said field oxide regions to establish the field threshold for said BJT.

23. The process of claim 22 wherein said implanting step also establishes the field threshold for said FET.

24. The process of claim 23 wherein said selected areas are disposed a predetermined distance away from said active areas.

25. The process of claim 24 wherein said dopant comprises phosphorous and said implanting step is performed at approximately 150 KeV.

26. The process of claim 25 wherein said field oxide regions are approximately 1000 Å thick.

* * * * *

US005336926C1

(12) EX PARTE REEXAMINATION CERTIFICATE (6244th)
United States Patent
Matthews

(10) Number: US 5,336,926 C1
(45) Certificate Issued: Jun. 10, 2008

(54) BIPOLAR JUNCTION EXHIBITING SUPPRESSED KIRK EFFECT

(75) Inventor: James A. Matthews, Milpitas, CA (US)

(73) Assignee: Microunity Systems Engineering, Inc., Sunnyvale, CA (US)

Reexamination Request:
No. 90/007,647, Jul. 29, 2005

Reexamination Certificate for:
Patent No.: 5,336,926
Issued: Aug. 9, 1994
Appl. No.: 08/113,510
Filed: Aug. 27, 1993

Related U.S. Application Data

(63) Continuation of application No. 07/840,853, filed on Feb. 25, 1992, now abandoned.

(51) Int. Cl.
*H01L 21/70* (2006.01)
*H01L 29/02* (2006.01)
*H01L 21/331* (2006.01)
*H01L 21/02* (2006.01)
*H01L 29/08* (2006.01)

(52) U.S. Cl. .................. 438/234; 438/207; 438/374; 438/375; 257/370; 257/592; 257/593; 257/754; 257/927; 257/E21.696; 257/E21.375; 257/E29.035; 257/657

(58) Field of Classification Search .................. None
See application file for complete search history.

(56) References Cited

U.S. PATENT DOCUMENTS 5,256,582 A * 10/1993 Mosher et al. ............... 438/206

OTHER PUBLICATIONS

Konaka, Shinsuke et al. "A 20 ps/G Si Bipolar IC Using Advanced SST With Collector Ion Implantation" by Shinsuke Konaka Extended Abstracts of the 19th Conference on Solid State Devices and Matemals, held Aug. 25–27, 1987, pp. 331–334.*
"A High Performance 0.5 mm BiCMOS Technology for Fast 4–Mb SRAM's " by James D. Hayden et al.; Jul. 1992 IEEE Transactions, pp. 1669–1679.*
Wolf, et al. Silicon Processing for the VLSI Era, vol. 2–Process Integration, Lattice Press: Sunset Beach CA, 1990, p. 492.*

* cited by examiner

*Primary Examiner*—Erik Kielin

(57) ABSTRACT

A bipolar junction transistor (BJT) which exhibits a suppressed Kirk Effect comprises a lightly-doped n-type collector region formed above a more heavily-doped n+ layer. Directly above the collector is a p-type base which has an extrinsic region disposed laterally about an intrinsic region. An n+ emitter is positioned directly above the intrinsic base region. The BJT also includes a localized n+ region disposed directly beneath the intrinsic base region which significantly increases the current handling capabilities of the transistor.

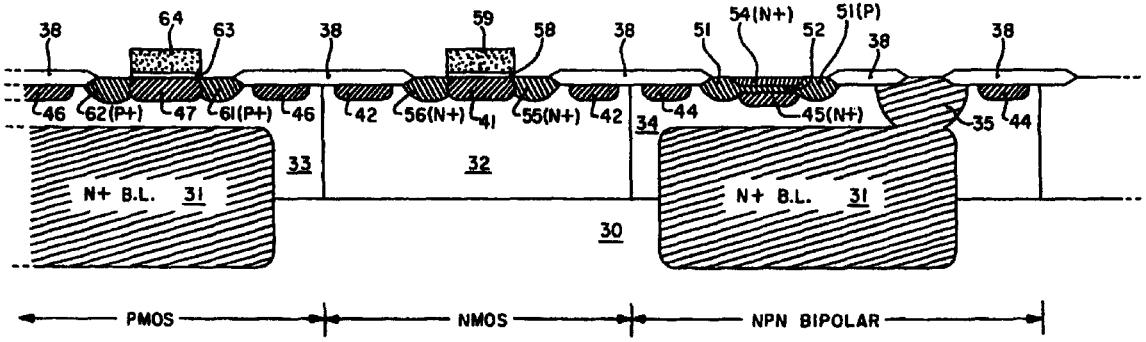

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 13–26 are confirmed.

Claims 1–12 are cancelled.

* * * * *